United States Patent [19]

Maher et al.

[11] Patent Number: 4,514,703
[45] Date of Patent: Apr. 30, 1985

[54] AUTOMATIC LEVEL CONTROL SYSTEM

[75] Inventors: John W. Maher, Woodstock; Greg M. Townsend, Palatine, both of Ill.

[73] Assignee: Motrola, Inc., Schaumburg, Ill.

[21] Appl. No.: 451,310

[22] Filed: Dec. 20, 1982

[51] Int. Cl.³ .............................................. H03G 3/30
[52] U.S. Cl. ..................................... 330/279; 330/134
[58] Field of Search ............... 330/134, 136, 278, 279; 381/102, 104

[56] References Cited

U.S. PATENT DOCUMENTS

| 3,555,192 | 1/1971 | Hymer | 179/1 |
| 4,068,092 | 1/1978 | Ikoma et al. | 179/1 |
| 4,112,384 | 9/1978 | Buchberger | 330/141 |
| 4,160,873 | 7/1979 | Beseke et al. | 178/58 |
| 4,243,837 | 1/1981 | Bertholon | 179/1 |
| 4,297,527 | 10/1981 | Pate | 179/1 |

FOREIGN PATENT DOCUMENTS 14208  1/1982  Japan ..................................... 330/278

OTHER PUBLICATIONS

J. Lewkowicz, "Automatic Gain Control with Equalizer", IBM Tech. Disclosure Bulletin, vol. 21, No. 9, pp. 3569-3570, Feb. 1979.

Primary Examiner—James B. Mullins
Assistant Examiner—G. Wan
Attorney, Agent, or Firm—John H. Moore; James W. Gillman; Edward M. Roney

[57] ABSTRACT

An automatic level control system is described for use with a voice processor which generates an AGC control signal to vary the gain applied to an audio input signal. The system includes a dynamically adjusting peak detector for detecting noise peaks and voice peaks while ignoring voice lulls which occur after a voice peak. Detected peaks are processed by an improved voice/noise sensor which develops a first output signal when voice is detected and a second output signal in the absence of detected voice. These output signals are received by a gain control circuit which is adapted to prevent the AGC control signal from increasing system gain for an indefinite interval in response to the second signal, and to permit normal variation in the AGC control signal in response to the first signal.

14 Claims, 5 Drawing Figures

AUTOMATIC LEVEL CONTROL SYSTEM

FIELD OF THE INVENTION

This invention is directed generally to systems which sense the amplitude of a variable audio input signal and adjust the gain applied to that input signal to provide a nearly constant amplitude output signal. AGC (automatic gain control) and ALC (automatic level control) systems are typical of the art to which the invention pertains.

BACKGROUND OF THE INVENTION

Conventional AGC systems are generally adequate to provide a nearly constant amplitude output signal as a sensed input signal varies in amplitude over a given range. However, when the input signal ceases, typical AGC action increases system gain to its maximum. This action gives rise to two problems. First, the level of background noise is greatly enhanced under maximum gain conditions. Second, should a large audio input signal arrive while the system is at maximum gain, an annoying large amplitude voice burst will be developed.

To overcome the foregoing problems with AGC, some audio systems now incorporate ALC. As with AGC systems, an ALC system operating on audio signals allows system gain to vary freely in the presence of the desired audio signal. However, ALC systems generally include a voice detection circuit that senses valid incoming voice signals and attempts to hold system gain to its most recent value when the incoming voice signal terminates. Theoretically, input noise which arrives in the absence of voice will not be greatly amplified, and the next voice signal to arrive will initially be amplified at the same level of gain which the last voice signal received. However, other problems with voice processing systems can fool conventional ALC systems and lead to reduced intelligibility. Examples of such problems are discussed with reference to FIGS. 1, 2 and 3.

Referring first to FIG. 1, a typical ALC system is shown as including a variable gain amplifier 10, a gain adjust block 12 for sensing the output of the amplifier 10 and varying its gain, and a voice detector 14. This illustrated system is similar to a conventional AGC system, except for the inclusion of the voice detector 14. Suffice it to say, the voice detector 14 looks for the presence of voice signals above a threshold and holds the gain adjust block 12 at its last valid gain value in the absence of voice. When a new voice signal is detected, the gain adjust block is allowed to adjust gain level according to the amplitude of the new voice signal.

Typically, the attack time (the time required for the gain adjust block to change from a high gain to a low gain condition) is chosen to be very fast. Its release time (the time required for the gain adjust block to change from a low gain to a high gain condition) is chosen so that when a new, lower amplitude voice source is received, the first few words or syllables will not go unheard.

In a typical application, the audio input to the ALC system shown in FIG. 1 is adapted to be switched between voice signals carried by different telephone lines which have different loss characteristics. Since these losses are somewhat unpredictable and vary with time, the ALC system should be capable of operating over a 35 db dynamic range.

Previous attempts to implement an ALC system have been only partially successful. Some of the problems encountered include mistaking noise for voice signals and failing to deliver intelligible speech. To further illustrate the latter problem, reference is made to FIGS. 2 and 3.

In FIG. 2, a speech pattern is shown which exemplifies a typical spoken syllable which is well within the illustrated 35 db dynamic range. Only the shaded voice peaks 16 and 18 extend beyond the threshold of the voice detector to pass an appropriate control signal to the gain adjust block 12. Thus, the gain adjust block 12 is permitted to respond to the peak 16 to adjust gain accordingly. However, since the voice lulls 20, 22 and 24 are below the voice detector's threshold, the gain adjust block holds the gain constant at the level previously established in response to the peak 16. This is a desired effect for voice intelligibility.

FIG. 3 shows another voice signal in which voice lulls 26, 28 and 30, as well as peaks 32 and 34, exceed the threshold of the voice detector. Accordingly, the gain adjust block 12 is enabled to change system gain during the lulls and the peaks. Thus, as the speech envelope decays, the gain adjust block increases gain in an attempt to maintain a constant output level. Not only does intelligibility suffer under such a condition, but the signal to noise ratio is degraded during the voice lulls. Words having a substantial low frequency content are particularly susceptible of being improperly amplified so that an increase in the ambient noise level is perceived.

To overcome the increase in noise which occurs during lulls of the type shown in FIG. 3, the decay rate of the gain adjust block may be reduced. However, this tends to render the ALC system insensitive to rapid amplitude variations which occur when the audio input is switched to a different voice source having a relatively higher loss characteristic. The first few syllables or words from the new voice source may go unheard because a longer decay rate prohibits a rapid adjustment in gain. Compromises between these conflicting requirements generally result in unsatisfactory intelligibility.

Another problem frequently associated with prior ALC systems is their inability to accurately hold constant or freeze the operation of the gain adjust block during intervals when voice is absent to prevent an unwanted increase in system gain. Typically, ALC systems attempt to freeze the gain level by holding constant a gain control voltage on a capacitor. This approach is satisfactory for short periods of time, but the charge on the capacitor eventually leaks off through various circuit elements, thereby permitting system gain to increse when it should be held constant.

Accordingly, it is a general object to the invention to provide an improved ALC system.

It is a more specific object of the invention to provide an ALC system which exhibits improved voice intelligibility.

It is another object of the invention to provide an ALC system which prevents the system gain from increasing for an indefinite duration in the absence of voice.

It is a further object of the invention to provide an ALC system which provides a high degree of noise and transient rejection to avoid changing the gain level in the presence of various types of noise.

SUMMARY OF THE INVENTION

Broadly stated, this invention provides an improved ALC system for operating with an audio processor which develops an AGC-type control signal and which applies the AGC control signal to a variable gain circuit to vary the gain applied to an input signal. According to one aspect of the invention, the ALC system includes peak detecting means for detecting, in the input signal, voice and noise peaks which exceed a predetermined threshold while ignoring syllabic rate voice lulls which occur subsequently to a detected voice peak. Preferably, the peak detecting means is adapted to ignore such voice lulls by virtue of AGC type circuitry which scales the input signal such that the amplitude of syllabic rate voice lulls is reduced below a detect threshold.

Detected peaks sensed by the peak detecting means are coupled to a noise/voice sensor. This sensor develops a first output signal when the received detected peaks are representative of voice, and a second output signal in the absence of detected noise peaks which signify the presence of voice.

A gain control means responds to the first signal by permitting the AGC control voltage to vary to thereby modify the gain applied to incoming voice signals. The gain control means responds to the second signal by preventing the value of the AGC control signal from changing in a direction which increases the gain applied to the input signal, thereby preventing the generation of high amplitude noise signals or excessive amplification of voice lulls.

According to another aspect of the invention, the noise/voice sensor includes means which receives clock pulses and the detected voice peaks for outputting the clock pulses in the absence of detected peaks and otherwise outputting the received detected peaks. Those outputs are received by a counter which is periodically initialized. If the counter fails to count, within a predetermined counting interval, a given number of such outputs, it develops the first output signal indicative of the presence of voice. If the counter does count the given number of outputs within a counting interval, it develops the second signal indicating the presence of noise or voice lulls, whereupon the level of the AGC control voltage is prevented from changing in a direction which increases the gain applied to the audio input signal.

According to another aspect of the invention, the gain control means includes another counter responsive to said second signal for counting clock pulses to generate a digital output representative of the count achieved. A digital-to-analog converter converts the digital output to a ramp signal which is compared to the AGC control signal. When these two signals are substantially equal to each other, the counter holds its count and the value of the ramp signal remains constant. The ramp signal is coupled to the AGC control signal to prevent the value of the latter signal from increasing system gain. With this arrangement, the gain of the system is held constant in the presence of voice lulls and relatively low amplitude noise. When relatively high amplitude noise is sensed, system gain is permitted to decrease in a conventional manner.

DESCRIPTION OF THE PREFERRED EMBODIMENT

Figure 4:
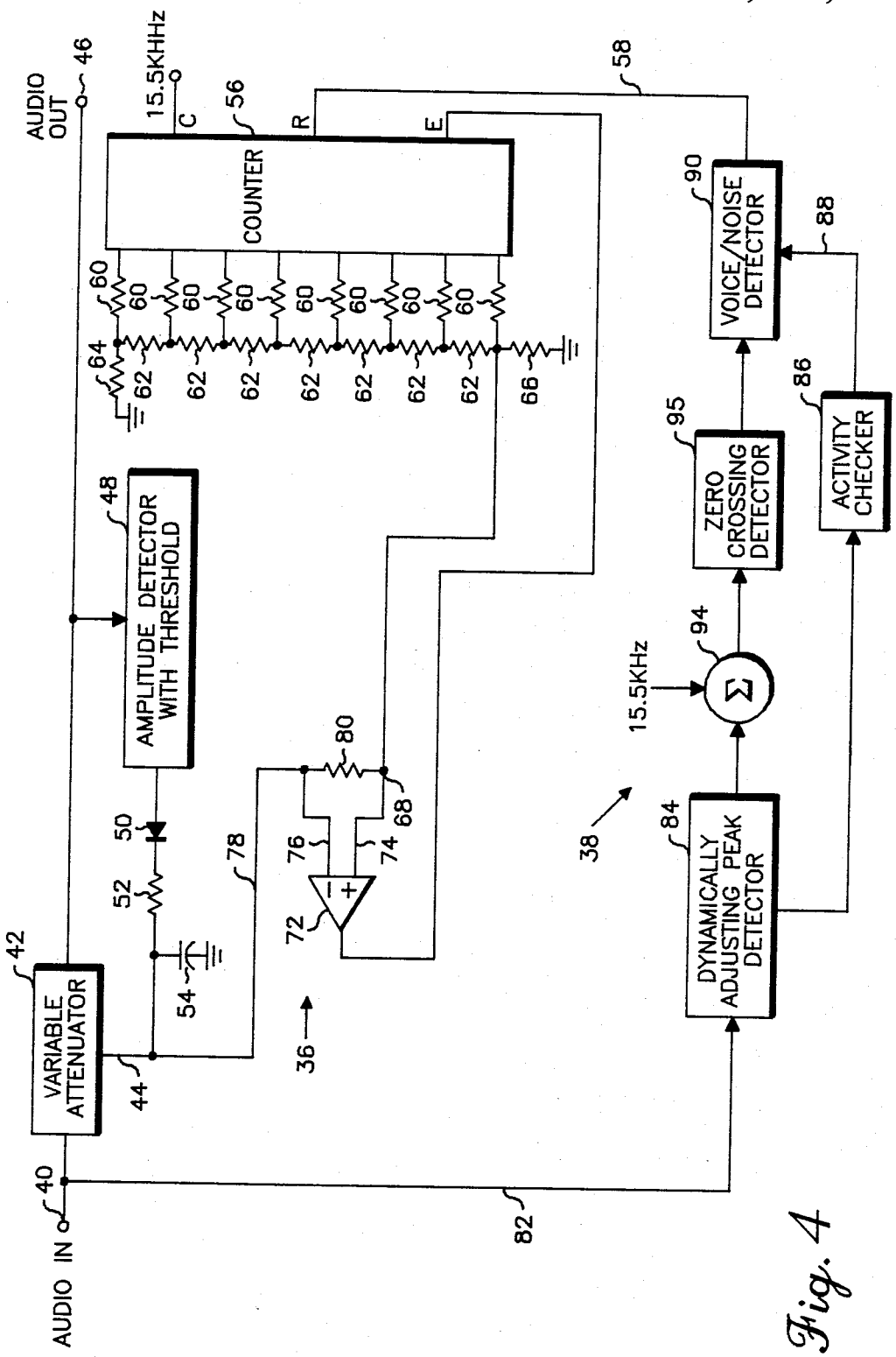
FIG. 4 depicts an ALC system according to the invention, primarily in block diagram form.

Referring to FIG. 4, an embodiment of the present ALC system is shown which may for purposes of explanation be considered as having two parts, an AGC portion 36 and a noise and voice detecting portion 38. The AGC portion of the system will be described first.

An audio input signal which includes desired voice and undesired noise is received at an input terminal 40. This signal is coupled to a conventional variable attenuator 42 whose attenuation is controlled by an AGC control signal appearing on a control lead 44. The output of the attenuator 42 appears at an output terminal 46. Alternately, the variable attenuator 42 may be replaced by a variable gain amplifier whose gain in controlled by the signal on lead 44. In either case, the voice signal appearing at the output terminal 46 is intended to have a substantially uniform amplitude irrespective of amplitude variations at the input terminal 40. Such variations are typically caused by different audio sources, each having different loss characteristics, being coupled to terminal 40.

The output of the attenuator 42 may be coupled to a conventional amplitude detector 48 which operates in cooperation with a diode 50, a resistor 52 and a storage capacitor 54 to form a conventional AGC control loop. As this configuration is conventional, it suffices to say that this combination detects signal excursions which exceed a threshold level to store on the capacitor 54 an AGC control signal which determines the attenuation (or gain) applied to the audio input signal.

When the audio input signal includes desired voice peaks, the AGC control signal is permitted to vary in the usual manner to hold the output signal substantially constant. In the absence of voice, however, it is desired to prevent the AGC control voltage from changing in a manner which increases system gain so as to prevent incoming noise from being output at an undesirably high level. Since voice may be absent for an indefinite period of time, the gain applied to the input signal must be prevented from increasing for an equally long period of time. This objective is met by the remainder of the AGC portion 36.

As shown, a counter 56 receives signals at its reset input via a lead 58 from the noise and voice detecting portion 38 of the system. When the signal on lead 58 is at a first or high level, this indicates that voice has been detected, wherefore counter 56 is held in a reset (not counting) condition. When the signal on lead 58 is at a second or low level (no voice detected), the counter 56 is enabled for counting clock pulses of 15.5 kilohertz, for example, which the counter receives at its clock input. A digital output representative of the count achieved is developed by the counter 56 and is applied to a digital-to-analog (D/A) converter. Preferably, the D/A converter is a resistive network comprising resistors 60 which are connected to the digital outputs of the counter 56, resistors 62 coupled to the opposite ends of the resistors 60, and resistors 64 and 66 which are coupled between ground and the top and bottom, respectively, of the resistive network. Each of the resistors 62 and 66 may have a normalized value of R, and the resistors 60 and 64 may have a normalized value of 2R.

With this arrangement, the D/A converter develops an analog ramp signal (at node 68) whose value is representative of the count in the counter 56. Thus, as the count increases, the value of the ramp signal at node 68 undergoes a corresponding increase.

A comparator 72 having two inputs receives the ramp signal from the node 68 at one input 74. Another input 76 to the comparator receives the AGC control signal via a lead 78. As shown, the comparator's inputs 74 and 76 are coupled to each other via a resistor 80. With this arrangement, the comparator 72 compares the AGC control signal to the ramp signal developed by the D/A converter. When the value of the ramp signal is substantially equal to the value of the AGC control signal, the comparator 72 toggles. The resulting signal at the output of the comparator 72 is coupled to the enable input of the counter 56. Consequently, the counter 56 is inhibited from counting further. It holds its last attained count, and the value of the ramp signal at the node 68 is held to its last value. At this point, the ramp signal at node 68 and the AGC control signal on the capacitor 54 are of substantially equal value. To ensure that the value of the signal on the capacitor 54 does not change in a manner which increases system gain, the ramp signal at the node 68 acts somewhat as a voltage source supplying charge to the capacitor 54, as needed, via the resistor 80. Thus, charge leakage from the capacitor 54 is replenished by this voltage source.

So long as the reset input to the counter 56 remains at a low level (no voice detected), the AGC control voltage is prevented from changing in a direction which increases the gain applied to the input signal. Thus, noise at the input terminal 40 is attenuated (or amplified) at the same level as the last received voice signal, provided that the amplitude of the noise signal is equal to or less than the amplitude of the last received voice signal. Higher amplitude noise signals are attenuated in the usual manner by virtue of the detector 48 changing the voltage on the capacitor 54. This condition can last indefinitely to preclude the generation of high level noise at the output terminal 46.

When voice is once again detected, the signal at the reset input of the counter 56 is driven high, and the counter 56 is held in a reset condition. In this condition, node 68 is at ground potential, and the capacitor 54 is permitted to discharge through the resistor 80 while the detector 48 supplies enough current to charge the capacitor 54 to the desired level of gain.

It can be seen, therefore, that normal AGC action occurs during the presence of detected voice. When voice is not detected, the counter 56, the D/A converter and the comparator 72 cooperate to prevent the AGC control signal from changing in a direction which increases the gain applied to the input signal.

Turning now to the noise and voice detecting portion 38, this part of this system functions basically to sense the audio input signal via a lead 82 and to drive its output lead 58 low in the absence of detected voice for preventing the AGC control signal from increasing gain. This function is effected in a manner which increases voice intelligibility.

Figure 3:
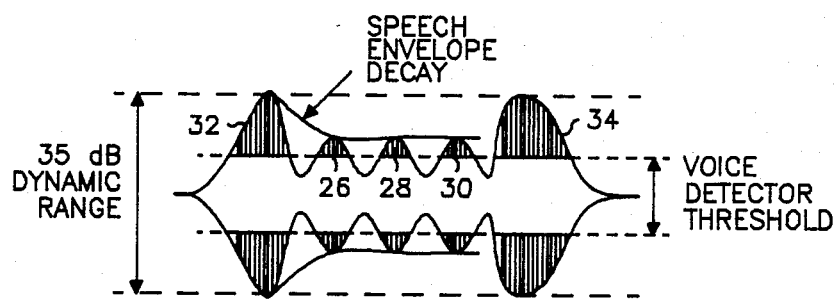

As discussed previously, improved voice intelligibility and lower background noise result when voice lulls are not treated as voice peaks which initiate a change in the AGC control signal. Referring briefly to FIG. 3, this means that the illustrated voice lulls 26, 28 and 30 should not be treated in the same manner as the voice peak 32. While that peak should be detected to ensure the generation of a "voice present" signal, voice lulls, even those which extend somewhat above the threshold of a voice detector, should be treated differently.

Toward this end, there is included a peak detecting means in the form of a dynamically adjusting peak detector 84. The function of the detector 84 is to sense voice peaks which exceed a predetermined threshold while dynamically ignoring syllabic rate voice lulls which occur subsequent to a detected voice peak. That is, voice lulls which occur during a normal syllable of speech, such as lulls 26, 28 and 30 of FIG. 3, are ignored by the detector 84 after detecting the peak 32. Accordingly, detection of the peak 32 during voice reception causes the signal on the lead 58 to go high. However, since the voice lulls immediately following the peak 32 are not detected (ignored), the signal on the lead 58 goes low to keep the gain applied to the input signal from increasing. The manner in which this function is effected is discussed in more detail below. Suffice it to say at this point that the output of the detector 84 includes voice peaks and noise peaks, but does not include syllabic rate voice lulls.

Coupled to the detector 84 is an activity checker 86. Broadly stated, the function of this element is to detect the presence of voice and noise signals which extend beyond a given threshold established by the activity checker. If no such signals are sensed, it is assumed that voice is absent, wherefore the activity checker's output lead 88 carries a "no-activity" signal to a voice/noise detector 90. In response, the detector 90 drives the lead 58 low to keep the AGC portion of the system from increasing its gain.

When the activity checker senses the presence of noise or voice activity, its output lead 88 carries an "activity present" signal to instruct the detector 90 that voice may be present. Whether it is voice or noise which is actually causing such activity is to be determined as described subsequently.

The output of the detector 84 is coupled to the input of a noise/voice sensing means in the form of a summer 94, a zero-crossing detector 95, and the detector 90. The noise/voice sensing means receives detected peaks from the detector 84 for determining from that information whether noise or voice is present. If the peaks are determined to represent voice, the detector 90 outputs a first, high level signal for application to the counter 56. If noise is sensed, the detector 90 outputs a second, low level signal (gain freeze) to permit the counter 56 to count clock pulses.

More specifically, the summer 94 receives the output of the detector 84 and 15.5 kilohertz clock pulses. Both inputs are summed and applied to the input of the zero-crossing detector 95. In response to these inputs, detector 95 outputs the 15.5 kilohertz clock pulses when no detected peaks are input to the summer 94. When a detected peak is received from the summer 94, that peak saturates the detector 95 so that the detector 95 outputs only an amplified detected peak. Thus, the output from the detector 95 is a sequence of amplified and "squared-up" clock pulses and detected peaks.

The voice/noise detector 90 preferably includes a counter which is adapted to be periodically initialized for counting the outputs of the zero-crossing detector 95. If the counter counts a sufficient number of outputs from the detector 95 within a given time interval, the output lead 58 is driven low to indicate that noise is present. If the counter does not reach a sufficient count within that interval, the lead 58 is driven high to indicate that voice is present. This mode of operation assumes, of course, that the activity checker 86 has developed its "activity present" signal. Otherwise, the determination that noise (or no voice) is present is controlled by the activity checker 86.

Figure 5:
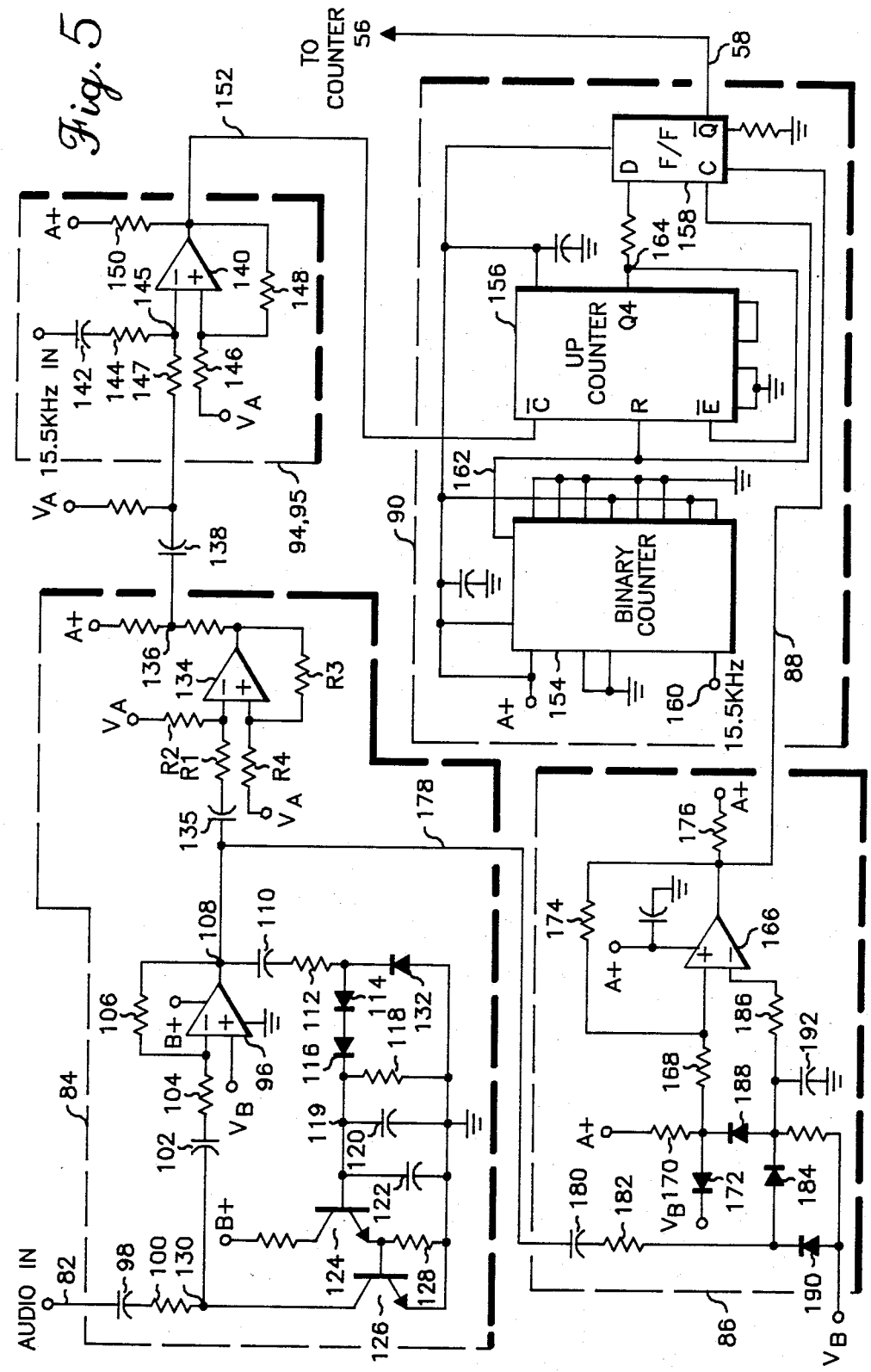
FIG. 5 is a detailed schematic diagram of the noise and voice detecting portion of the system shown in FIG. 4.

Turning now to FIG. 5, a detailed diagram is shown of an embodiment of the noise and voice detecting portion 38 of the system. The dynamically adjusting peak detector 84 is shown as including an amplifier 96 which receives audio inputs via the lead 82. These inputs are coupled to an inverting input of the amplifier 96 via a capacitor 98, a resistor 100, another capacitor 102 and another resistor 104. A feedback resistor 106 is coupled between the input and output of the amplifier 96, and a bias voltage $V_B$ is coupled to its non-inverting input.

The function of the amplifier 96 is to cooperate with an AGC-type feedback loop to receive and scale the input signal received via the lead 82. Such scaling is effected so that voice lulls do not exceed a predetermined threshold and are, therefore, not detected by circuitry downstream of the amplifier 96. The output of the amplifier 96 (at node 108) is substantially identical to the input signal at lead 82, except that the input signal has been automatically scaled so as to prevent the subsequent detection of voice lulls.

The feedback loop referred to above has its input at the node 108 and its output at another node 130. Coupled between these nodes is a peak detector which includes a resistor 112 coupled in series with diodes 114 and 116, a resistor 118 coupled between ground and a node 119, and a capacitor 120 coupled in parallel with the resistor 118. A high frequency bypass capacitor 122 may be coupled in parallel with the capacitor 120, and a level shifting diode 132 is coupled between ground and the junction of resistor 112 and diode 114.

Coupled to the node 119 is a voltage-controlled attenuator shown as transistors 124 and 126. The base of the transistor 124 is coupled to the capacitor 120, and its emitter is coupled to ground through a resistor 128. The base of transistor 126 is coupled to the emitter of transistor 124, and its collector is coupled to the node 130.

The operation of this portion of the detector 84 will be explained in terms of exemplary inputs later. For now, it suffices to say that the amplifier 96, the peak detector and the voltage-controlled attenuator operate to develop, at the node 108, a scaled version of the input signal so that voice peaks, but not voice lulls, exceed a predetermined detect threshold.

The remainder of the detector 84 comprises a comparator 134 having hysteresis. The inverting input of this comparator is coupled to the node 108 via a capacitor 135 and a resistor R1. Another resistor R2 couples the inverting input to a voltage source Va. A feedback resistor R3 is coupled between the output of comparator 134 and its non-inverting input, and a resistor R4 is coupled between the source Va and the non-inverting input to provide hysteresis. With this arrangement, the comparator 134 and its associated circuitry operate as a zero-crossing detector with hysteresis for detecting voice peaks received from the node 108. Such peaks are detected only when they exceed a threshold value which is established by the resistors R1 through R4.

Figure 1:
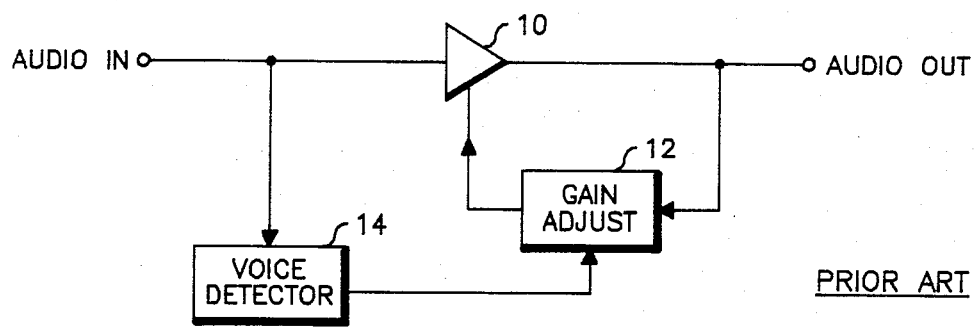
FIG. 1, previously described, illustrates a conventional ALC system.
Figure 2:
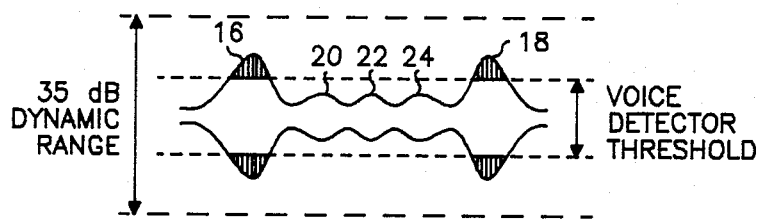
FIGS. 2 and 3, also previously described, illustrate electrical signals corresponding to voice syllables for explaining various problems associated with conventional ALC systems.

The operation of the detector 84 will now be explained by assuming that a signal such as that shown in FIG. 2 is coupled to the audio input line 82. The peaks 16 and 18 are assumed to extend beyond the threshold associated with the comparator 134, whereas the lulls 20, 22 and 24 are assumed to be below it. Thus, in response to the peak 16, the amplifier 96 outputs a similar peak at the node 108. That peak charges the capacitor 120 through the resistor 112 and the diodes 114 and 116. Assuming that the capacitor 120 becomes sufficiently charged, the transistors 124 and 126 are thereby biased to conduct as a function of the level of the charge on capacitor 120. As a result of such conduction, signals at the node 130 are attenuated.

Before discussing the effect generated by the lull 20, it is appropriate to describe the time constants associated with the capacitor 120. The charging time constant of the capacitor 120 is controlled by the value of the resistor 112 and is relatively short. The discharging time constant of the capacitor 120 is relatively long and is determined by the resistor 118. More specifically, the capacitor 120 is adapted to charge relatively fast in response to a voice peak and to hold its charge during subsequent syllabic rate voice lulls so that such lulls are attenuated as a function of the amplitude of the preceding voice peak. Thus, a voice peak which charges the capacitor 120 sets the level to which subsequent voice lulls are scaled.

In practice, a charging time constant of about 1/15 of a second and a discharging time constant of 1.8 seconds were found to be effective. This allows syllabic rate voice lulls occurring at about 7 hertz to be properly processed.

Returning to the signal shown in FIG. 2, the voice lull 20 is now input to the detector 84. Since the amplitude of this lull is insufficient to cause conduction of the diodes 114 and 116, the charge on the capacitor 120 does not change significantly and the transistors 124 and 126 remain in their previously-established state of conduction. The same effect occurs when the voice lulls 22 and 24 are received. When the peak 18 is received, the capacitor 120 may be charged to a different level and cause a correspondingly different level of conduction in transistors 124 and 126. Thus, a new scaling level is set for following voice lulls, and the comparator 134 outputs detected peaks at the node 136 only in response to the peaks 16 and 18.

Assuming now that the signal shown in FIG. 3 is input to a detector 84, the peak 32 causes the amplifier 96 to output a similar peak at the node 108. That peak charges the capacitor 120 and turns on transistors 124 and 126 as previously described.

The amplitude of the lull 26, as it appears on the lead 82, exceeds the threshold associated with the comparator 134. However, the long discharging time constant associated with capacitor 120 causes the transistor 126 to remain on and attenuate or scale down the lull 26. The same effect occurs with respect to the lulls 28 and 30. Thus, only the peak 32 results in a signal at the node 108 which exceeds the detect threshold associated with the comparator 134. Consequently, the comparator 134 outputs, at node 136, a detected peak in response to the voice peak 32, but outputs no detected peaks in response to the lulls 26, 28 and 30.

The illustrated embodiment of the summer 94 and the zero-crossing detector 95 are shown in the same box in FIG. 5. The summer 94 includes a capacitor 142 in series with a resistor 144 for coupling 15.5 kilohertz clock pulses to a node 145. The summer 94 also includes a resistor 147 which is serially coupled to the capacitor 138 for coupling the output of the comparator 134 to the node 145.

The zero-crossing detector 95 includes a comparator 140 whose inverting input is coupled to the node 145. The non-inverting input is coupled to the source Va by a resistor 146 and to the comparator's output via another resistor 148. The output of the comparator is coupled to a voltage source A+ via a resistor 150 and to the detector 90 via a lead 152.

The operation of the summer 94 and the zero-crossing detector 95 will now be explained in terms of the audio signal shown in FIG. 3. When the voice peak 32 occurs, the detector 84 generates a detected voice peak at the node 136. That detected peak is applied to the non-inverting input of the comparator 140. This input is dominant and typically has a duration much longer than a 15.5 kilohertz clock pulse. Accordingly, the comparator 140 outputs, on the lead 152, a relatively long duration detected peak. No 15.5 kilohertz pulses are output for the duration of the detected peak.

When the voice peak 32 terminates, the comparator 140 begins outputting 15.5 kilohertz clock pulses. The occurence of the voice lulls 26, 28 and 30 does not terminate the output of clock pulses from the amplifier 140 since none of those lulls resulted in a detected peak. Thus, the comparator 140 outputs clock pulses, except during intervals when detected peaks are received from the detector 84. The continued presence of such clock pulses on the lead 152 is interpreted as a condition during which the AGC control signal is not to permit an increase in system gain.

The illustrated embodiment of the voice/noise detector 90 includes a binary counter 154, an up counter 156 and a flip-flop 158. The binary counter 154 periodically initializes the up counter 156 so that the latter counter may count pulses on the lead 152 during predetermined intervals. Preferably, the counter 156 is initialized every 12.8 milliseconds.

For this purpose, the counter 154 receives 15.5 kilohertz clock pulses at an input 160 for outputting 77 hertz pulses on a lead 162. The pulses on the lead 162 are of very short duration and initialize the counter 156 every 12.8 milliseconds and latch the Q4 output of the counter 156 into the flip-flop 158.

The up counter 156, once initialized, begins counting the pulses on the lead 152. If it counts 16 pulses within a 12.8 millisecond interval, its output at 164 goes high to drive the counter's E̅ input high. With the E̅ input high, the counter 156 stops counting and holds its output at 164 high. In turn, the flip-flop 158 latches the lead 58 to a low level to indicate a non-voice or noise condition.

The basis for choosing a 12.8 millisecond counting interval for the counter 156 and the frequency of the 15.5 kilohertz clock pulses applied to the summer 94 is that a count of 16 such pulses within that interval is indicative of a spectral energy content which is predominantly greater than 1200 hertz. Since the energy content of voice is predominantly lower than 1200 hertz, a detected spectral energy above 1200 hertz is indicative of noise. Thus, the frequency of the clock pulses and the counting interval of the counter 156 are selected such that counting a given number of clock pulses within the counting interval is indicative of the audio input signal having a spectral energy content which is predominantly greater than 1200 hertz.

Not only do the counter 156 and the flip-flop 158 prevent the gain of the AGC portion of the system from increasing during relatively low amplitude noise, the same effect is achieved during voice lulls. For example, the voice peak 32 of FIG. 3 causes a peak detected signal to propagate to the counting input (lead 152) of the counter 156. Because the peak 32 typically lasts longer than a counting interval, the counter 156 will not reach a count of 16 when the voice peak is present. However, when the voice lulls 26, 28 and 30 occur, the zero-crossing detector 95 outputs a continuous sequence of 15.5 kilohertz clock pulses. During that time, the counter 156 reaches successive counts of 16 to hold the signal on the lead 58 at a low level. Hence, the value of the AGC control signal is held to the value it obtained during the occurence of the voice peak 32. The desired result is that the voice lulls 26, 28 and 30 receive the same degree of attenuation (or gain) as the voice peak 32. This provides improved intelligibility and prevents background noise from being over-amplified.

Turning now to the activity checker 86, it includes a comparator 166 having an inverting input and a non-inverting input. The non-inverting input is coupled via resistors 168 and 170 to the A+ voltage source. The junction between these resistors is coupled to the source VB via a diode 172. A resistor 174 couples the amplifier's input to its output, and another resistor 176 couples the A+ source to the output of the comparator.

The inverting input of the comparator 166 is coupled to the node 108 via a lead 178, a capacitor 180, a resistor 182, a diode 184 and another resistor 186. A diode 188 couples the cathode of diode 184 to the anode of diode 172, and a level shifting diode 190 is coupled between the bias voltage VB and the anode of diode 184. A capacitor 192 is coupled between ground and the junction between the diode 184 and the resistor 186.

In operation, the diode 172 and the bias voltage VB essentially establish a threshold voltage beyond which a detected peak must extend in order for the comparator 166 to conduct. Detected peaks generated by the detector 84 charge a capacitor 192 through the resistor 182 and the diode 184. If a detected peak charges the capacitor 192 above the threshold, the output of the comparator 166 drops from A+ to ground. This corresponds to an "activity present" signal which is coupled to the flip-flop 158 via the lead 88. Under this condition, the counter 156 controls the state of the signal on lead 58.

When no signal activity is present or when the capacitor 192 is insufficiently charged, the output of the comparator 166 remains high, corresponding to a "no-activity" condition. Consequently, the signal on the lead 88 causes the flip-flop 158 to drive the lead 58 low.

In addition to the advantages of improved intelligibility and the ability to prevent gain from increasing for indefinite periods of time, the present system properly detects and responds to the presence of various types of noise. For example, when very low level background noise is present, the activity checker 86 causes the flip-flop 158 to signal a "gain freeze" condition. As the background noise increases in amplitude, it may overcome the threshold associated with the activity checker. However, this form of noise typically passes through the detector 84 and is output from the zero-crossing 95. Under this condition, such noise pulses are high enough in frequency to cause the counter 156 to reach its count of 16 in one counting interval. Thus, noise is again detected properly.

When a large amplitude, long duration noise pulse (transient) occurs, it passes through the detector 84 and is differentiated by the capacitor 138 to develop a short duration noise spike which does not saturate the amplifier 140 for a long interval. Consequently, the counter 156 is still able to reach its count of 16 and signal the presence of noise.

While the system described above prevents system gain from increasing during voice lulls and relatively low amplitude noise inputs, it should be recalled that system gain is decreased in response to relatively large amplitude noise spikes. In the presence of such noise spikes, the output of the detector 48 (FIG. 4) varies the charge on the capacitor 54 to cause a brief decrease in system gain.

The ALC system thus described provides improved voice intelligibility and very good noise rejection, particularly in applications where received voice signals originate from lossy telephone lines and the like. The system's ability to prevent gain from increasing indefinitely and to properly process voice lulls and noise are primarily responsible for these desirable effects.

Although the invention has been described in terms of preferred structure, it will be obvious to those skilled in the art that many alterations and modifications may be made without departing from the invention. Accordingly, it is intended that all such modifications and alterations be considered as within the spirit and scope of the invention as defined by the appended claims.

What is claimed is:

1. In an automatic level control system receiving an input signal comprising voice and noise, having means for developing an AGC control signal, and having a variable gain circuit responsive to the control signal for varying the gain applied to the input signal, the improvement comprising:

peak detecting means for detecting, in the input signal, voice peaks which exceed a predetermined threshold while dynamically ignoring syllabic rate voice lulls which occur subsequent to a detected voice peak;

noise/voice sensing means receiving detected voice peaks from the peak detecting means for determining when voice signals are present and thereupon developing a first signal, and for developing a second signal in the absence of those detected voice peaks which signify the presence of voice; and gain control means responsive to said first signal for permitting the AGC control voltage to vary to thereby modify the gain applied to incoming voice signals, and responsive to the second signal for preventing the value of the AGC control signal from changing in a direction which increases the gain applied to the input signal, thereby preventing the generation of high amplitude noise signals or unintelligible voice signals.

2. The improvement as set forth in claim 1 wherein said gain control means includes a counter responsive to said second signal for counting clock pulses to generate a digital output representative of the count achieved, means for generating an analog ramp signal whose value is representative of the count in the counter, a comparator for comparing the AGC control signal to the ramp signal and for causing the counter to hold its count when the value of the ramp signal is substantially equal to the value of the AGC control signal, and means for coupling the ramp signal to the AGC control signal so as to prevent the value of the latter signal from changing in a direction which increases the gain applied to the input signal.

3. The improvement as set forth in claim 2 wherein the counter responds to said first signal so as to prevent the generation of the ramp signal and thus permit the AGC control signal to vary in accordance with the input signal.

4. The improvement as set forth in claim 1 wherein said peak detecting means includes means for receiving and scaling the input signal so that voice lulls do not exceed said predetermined threshold, and means receiving the scaled signal for outputting a detected voice peak in response to each scaled voice peak which exceeds the predetermined threshold.

5. The improvement as set forth in claim 4 wherein said means for outputting a detected voice peak includes a zero-crossing detector.

6. The improvement as set forth in claim 4 wherein said scaling means includes an amplifier receiving the input signal and means responsive to a voice peak output from the amplifier for reducing the amplitude of the input signal during at least a syllabic interval following said voice peak.

7. The improvement as set forth in claim 6 wherein said means for reducing the amplitude of the input signal includes a peak detector for detecting voice peaks output by the amplifier, and a voltage-controlled attenuator responsive to the amount of charge accumulated by the peak detector for effecting a corresponding reduction in the amplitude of signal inputs to the amplifier.

8. The improvement as set forth in claim 7 wherein said peak detector is adapted to charge relatively fast in response to a voice peak and to hold its charge during subsequent syllabic rate voice lulls so that said lulls are attenuated as a function of the amplitude of the preceding voice peak, whereby the output of the amplifier is a scaled-down version of the input to the amplifier.

9. The improvement as set forth in claim 1 wherein said noise/voice sensing means includes:

circuit means receiving detected peaks and clock pulses and adapted to output said clock pulses in the absence of detected peaks and otherwise to output the received detected peaks; and a counter adapted to be periodically initialized for counting the outputs of said circuit means for developing said first signal upon failing to count, within a predetermined counting interval, a given number of outputs from said circuit means, and for developing said second signal upon counting at least said given number of outputs within the same interval.

10. The improvement as set forth in claim 9 wherein the frequency of the clock pulses received by said circuit means and the predetermined counting intervals associated with said counter are selected such that said given number of clock pulses within one of said intervals is indicative of the input signal having a spectral energy content which is predominantly greater than about 1200 hertz.

11. The improvement as set forth in claim 10 wherein the clock pulse frequency is selected to be about 15.5 kilohertz.

12. In an automatic level control system receiving an input signal comprising voice and noise, having means for developing an AGC control signal on a storage capacitor, and having a variable gain circuit responsive to the control signal for varying the gain applied to the input signal, the improvement comprising:

means receiving the input signal for detecting the absence of voice therein, and thereupon developing a gain freeze signal;

a counter responsive to the gain freeze signal for initiating counting of clock pulses to generate a digital output representative of the count achieved;

means for converting the digital output to an analog ramp signal whose instantaneous value is representative of the instantaneous value of the digital output;

a comparator for comparing the AGC control signal to the ramp signal and for causing the counter to hold its count when the value of the ramp signal is substantially equal to the value of the AGC control signal; and means for coupling the ramp signal to the storage capacitor so as to supply charge to the capacitor for preventing the value of the AGC control signal from changing in a direction which increases the gain applied to the input signal.

13. In an automatic level control system receiving an input signal comprising voice and noise, having means for developing an AGC control signal on a storage capacitor, and having a variable gain circuit responsive to the control signal for varying the gain applied to the input signal, the improvement comprising:

peak detecting means for receiving and scaling the input signal such that the amplitude of voice lulls is reduced below a predetermined threshold, and for detecting, in the scaled signal, voice peaks which exceed the threshold;

circuit means receiving clock pulses and receiving detected peaks from the peak detecting means for outputting the clock pulses in the absence of detected peaks and otherwise outputting the received detected peaks;

a counter adapted to be periodically initialized for counting the outputs of said circuit means for developing a first signal upon failing to count, within a predetermined counting interval, a given number of said outputs, and for developing a second signal upon counting at least said given number of outputs within the same interval; and gain control means responsive to said first signal for permitting the AGC control voltage to vary to thereby modify the gain applied to the incoming voice signals, and responsive to the second signal for preventing the value of the AGC control voltage from changing in a direction which increases the gain applied to the input signal.

14. The improvement as set forth in claim 13 wherein said gain control means includes a counter responsive to said second signal for counting clock pulses to generate a digital output representative of the count achieved, means for converting the digital output to an analog ramp signal, a comparator for comparing the AGC control signal to the ramp signal and for causing the counter to hold its count when the value of the ramp signal is substantially equal to the value of the AGC control signal, and means for coupling the ramp signal to the AGC control signal to prevent the value of the latter signal from changing in a direction which increases the gain applied to the input signal.

* * * * *